(12) United States Patent
Salimath et al.

(10) Patent No.: US 11,955,973 B1
(45) Date of Patent: Apr. 9, 2024

(54) SYSTEM AND METHOD FOR SKYRMION BASED LOGIC DEVICE

(71) Applicant: Ceremorphic, Inc., San Jose, CA (US)

(72) Inventors: Akshaykumar Salimath, Hyderabad (IN); Sanghamitra Debroy, Hyderabad (IN); Venkat Mattela, San Jose, CA (US)

(73) Assignee: CEREMORPHIC, INC., San Jose, CA (US)

( * ) Notice: Subject to any disclaimer, the term of this patent is extended or adjusted under 35 U.S.C. 154(b) by 43 days.

(21) Appl. No.: 17/829,109

(22) Filed: May 31, 2022

(51) Int. Cl.
*H03K 19/20* (2006.01)
*H03K 19/18* (2006.01)

(52) U.S. Cl.
CPC .............. *H03K 19/20* (2013.01); *H03K 19/18* (2013.01)

(58) Field of Classification Search
None
See application file for complete search history.

(56) References Cited

U.S. PATENT DOCUMENTS

| 9,653,136 | B2 * | 5/2017 | Cros | G11C 11/1673 |
| 11,700,001 | B1 * | 7/2023 | Debroy | H03K 19/18 |
| | | | | 326/104 |
| 2008/0100345 | A1 * | 5/2008 | Bratkovski | H10N 59/00 |
| | | | | 977/933 |
| 2022/0366955 | A1 * | 11/2022 | Wang | H10N 50/85 |

* cited by examiner

*Primary Examiner* — Jany Richardson
(74) *Attorney, Agent, or Firm* — MININANDRAM LAW FIRM; Raghunath S. Minisandram

(57) ABSTRACT

A system and method for a logic device is disclosed. A first nanotrack along a first axis and a second nanotrack along a second axis perpendicular to the first axis are disposed over a substrate. The second nanotrack is disposed over the first nanotrack in a overlap portion. An input value is defined about a first end of the first nanotrack and the second nanotrack by nucleating a skyrmion, wherein a presence of the skyrmion defines a first value and absence of the skyrmion defines a second value. The nucleated skyrmion moves towards the second end of the nanotracks when a charge current is passed through the first nanotrack and the second nanotrack along the second axis. The presence of the skyrmion sensed at the second end of the nanotrack indicates an output value of the first value.

18 Claims, 5 Drawing Sheets

|     | INPUT A | INPUT B | OUTPUT | LOGIC |
| --- | --- | --- | --- | --- |
| 218 | 0 | 0 | 0 | OR |
| 220 | 0 | 1 | 1 | OR |
| 222 | 1 | 0 | 1 | OR |
| 212 | 1 | 1 | 1 | OR |
| 224 | 0 | 0 | 0 | AND |
| 214 | 0 | 1 | 0 | AND |
| 216 | 1 | 0 | 0 | AND |
| 210 | 1 | 1 | 1 | AND |

SYSTEM AND METHOD FOR SKYRMION BASED LOGIC DEVICE

RELATED APPLICATION

None

TECHNICAL FIELD

The present invention relates generally to logic devices and more specifically, to skyrmion based logic devices.

DESCRIPTION OF RELATED ART

The rapid development of information technology has ensured a continuous increase of the logic density over the past years. As the VLSI technology and associated CMOS based logic devices reach their limits, further increase in logic device density capacity can only be accomplished through novel approaches.

Further, continued requirement for minimal power consumption in computing devices configured to use these devices and utilization of semiconductor technology to construct these devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A first nanotrack along a first axis and a second nanotrack along a second axis perpendicular to the first axis are disposed over a substrate. The second nanotrack is disposed over the first nanotrack in a overlap portion. An input value is defined about a first end of the first nanotrack and the second nanotrack by nucleating a skyrmion, wherein a presence of the skyrmion defines a first value and absence of the skyrmion defines a second value. The nucleated skyrmion moves towards the second end of the nanotracks when a charge current is passed through the first nanotrack and the second nanotrack along the second axis. The presence of the skyrmion sensed at the second end of the nanotrack indicates an output value of the first value.

In another embodiment, a system is disclosed. A first nanotrack along a first axis and a second nanotrack along a second axis perpendicular to the first axis are disposed over a substrate. The second nanotrack is disposed over the first nanotrack in a overlap portion. An input value is defined about a first end of the first nanotrack and the second nanotrack by nucleating a skyrmion, wherein a presence of the skyrmion defines a first value and absence of the skyrmion defines a second value. The nucleated skyrmion moves towards the second end of the nanotracks when a charge current is passed through the first nanotrack and the second nanotrack along the second axis. The presence of the skyrmion sensed at the second end of the nanotrack indicates an output value of the first value.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures:

FIG. 2A shows an example truth table for a two input logic device, according to one aspect of the present disclosure;

DETAILED DESCRIPTION

To facilitate an understanding of the adaptive aspects of the present disclosure, an example logic device will be described. The specific construction and operation of the adaptive aspects of various elements of the example logic device is described.

Figure 1:
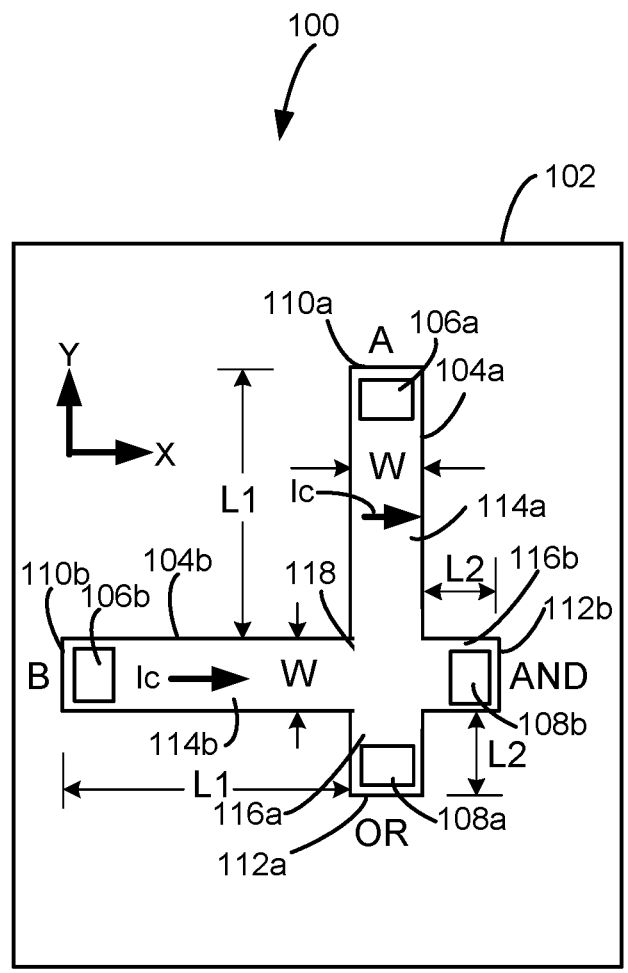
FIG. 1 shows an example logic device, according to one aspect of the present disclosure.

FIG. 1 shows an example logic device 100. The logic device 100 includes a substrate 102, a first nanotrack 104a and a second nanotrack 104b, a plurality of nucleating devices 106a, and 106b, and a plurality of sense devices, for example, first sense device 108a and second sense device 108b. The substrate 102 is a conductive metal layer. The substrate 102 is substantially made of heavy metal, such as Tantalum (Ta), Platinum (Pt), or Tungsten (W) or an alloy of heavy metal. In one example, the substrate 102 is a layer of thin film with a very large spin hall angle, such as a layer of thin film of Tantalum (Ta), Platinum (Pt), or Tungsten (W) or an alloy of Tantalum (Ta), Platinum (Pt), or Tungsten (W). The substrate 102 is configured to introduce interfacial DMI required for the stabilization of nucleated skyrmions. The thickness of the substrate 102 may be of the order of about 2 nm to about 5 nm. As one skilled in the art appreciates, the substrate 102 may be deposited on a base layer (not shown). In some examples, base layer may be a silicon wafer.

The first nanotrack 104a, and the second nanotrack 104b are disposed over the substrate. The first nanotrack 104a, and the second nanotrack 104b are composed of ferromagnetic material. In some examples, a suitable cobalt-nickel alloy or other similar materials (for example, nickel iron alloy, or cobalt, iron, nickel alloys) that provide high magnetic permeability may be used. In one example, the first nanotrack 104a, and the second nanotrack 104b are substantially rectangular in shape and are disposed substantially perpendicular to each other, with first nanotrack 104a disposed about Y axis, and the second nanotrack 104b disposed about X axis. Each of the first nanotrack 104a and the second nanotrack 104b have a first end and a second end. For example, first nanotrack 104a has a first end 110a and a second end 112a. The second nanotrack 104b has a first end 110b and a second end 112b. Each of the first nanotrack 104a and the second nanotrack 104b have a long portion and a short portion. For example, first nanotrack 104a has a long portion 114a and a short portion 116a. The second nanotrack 104b has a long portion 114b and a short portion 116b. The first nanotrack 104a and the second nanotrack 104b overlap with each other in the overlap portion 118. In one example, a width W of the first nanotrack 104a and the second nanotrack 104b is about nanometers. In one example, a length L1 of the long portion 114a and 114b is about 160 nm. And, the length L2 of the short portion 116a and 116b is about 60 nm. In one example, a thickness of the first nanotrack 104a and the second nanotrack 104b is about 1 nanometer.

Nucleating devices 106a, and 106b are disposed about the first end of the nanotracks 104a, and 104c respectively. For example, nucleating device 106a is disposed about the first end 110a of the left nanotrack 104a. Nucleating device 106b is disposed about the first end 110b of the middle nanotrack 104b. In one example, the nucleating devices are magnetic tunnel junction devices. By selectively passing current through the nucleating devices, a skyrmion is nucleated about the first end of the nanotrack. In one example, presence of the skyrmion is indicative of a first value, for example, a value of 1 and absence of the skyrmion is indicative of a second value, for example, a value of 0. In this example, the nucleating device 106a sets the input value for input A. The nucleating device 106b sets the input value for input B.

Skyrmions are topologically protected magnetic configurations observed in magnets lacking inversion symmetry. Their topological protection comes from nonzero winding number. This result in their robustness against thermal fluctuations and disorder. Magnetic skyrmions are technologically intriguing due to their small size (typically less than 10 nm), ultra low currents required for their manipulation, for example, selective movement inside the nanotracks. They have large annihilation energy barrier (annihilation energy $E_a > 50\ k_BT$ where $k_B$ is Boltzmann constant and T is temperature. This large annihilation energy barrier can result in lifetimes greater than 10 years, generally suitable for device applications.

Skyrmions are stabilized by the presence of Dzyaloshinskii-Moriya interactions (DMIs) observed in chiral magnets or at the ferromagnet/heavy metal layer (FM-HM layer) interface. The interfacial spin orbit interaction give rise to DMI interaction at the FM-HM layer interface and is responsible for the stabilization of skyrmion bits in the ferromagnet. The same interfacial spin orbit interaction is responsible for spin Hall effect in the heavy metal layer. Further, the proposed design the skyrmions are confined to the ferromagnet nanotracks due to edge repulsion. The skyrmion bits are nucleated by passing current through the magnetic tunnel junction positioned at each of the input nodes. The skyrmions are propagated through the action of spin transfer torque resulting from a charge current directly injected into the ferromagnet material.

In general, magnetic skyrmion is a stable nano sized spin configurations with topological property that is locally nucleated by injection of spin-polarized current and displaced in the ferromagnet nanotrack by current-induced spin torques.

The first sense device 108a is selectively disposed about the second end 112a of the first nanotrack 104b. The second sense device 108b is selectively disposed about the second end 112b of the second nanotrack 104b. The first sense device 108a and the second sense device 108b are configured to sense the presence of the skyrmion about the second end of the first nanotrack 104a and the second end of the second nanotrack 104b respectively. In one example, presence of the skyrmion is indicative of a first value, for example, a value of 1 and absence of the skyrmion is indicative of a second value, for example, a value of 0. In some examples, the sense device 108 is a magnetic tunnel junction device.

When a charge current Ic is passed through the ferromagnetic nanotracks, nucleated skyrmions are configured to travel towards the second end of the nanotrack. In one example, the charge current Ic is passed along the X axis and the skyrmion in the second nanotrack 104b will move along the X axis, towards the second end 112b. And, the skyrmion in the first nanotrack 104a will move along the −Y axis, in a direction transverse to the direction of the charge current Ic (which in this case is along +X direction). The skyrmion nucleated in the second nanotrack 104b move along the X axis, due to the spin transfer torque. Further, the skyrmions are confined to the nanotracks due to edge repulsion. In one example, the skyrmion nucleated in the second nanotrack 104b has a tendency to be biased to shift along the −Y direction, as they move towards the second end of the second nanotrack, along the X direction. In one example, the velocity of movement of the skyrmion in the first nanotrack 104a is higher than the velocity of movement of the skyrmion in the second nanotrack 104b. In one example, the velocity V1 of the skyrmion moving in the first Nanotrack 104a is given by the equation $(1/\alpha)*$(charge current density). And, the velocity V2 of the skyrmion moving in the second nanotrack 104b is given by the equation $(\beta/\alpha)*$(charge current density). In these equations, $\alpha$ is the damping constant and $\beta$ is a measure of spin mistracking, both dependent on the chosen magnetic material for the nanotracks. In one example, the ratio $(\beta/\alpha)$ is so chosen to be a fraction, thereby resulting in the velocity V2 lower than the V1. In one example, $\beta$ is about 0.4 and $\alpha$ is about 0.5. In one example, the velocity V1 may be of the order of about 30 m/sec to about 60 m/sec. In general, collective action of spin transfer torque, edge repulsion, and skyrmion-skyrmion interactions are advantageously used in the operation of the logic device to implement a combination of both AND and OR logic. Further details about the selective movement of the nucleated skyrmions along the nanotracks and implementation of a combination of both AND OR logic will nosy be described with reference to FIGS. 2B to 2E.

Figure 2C:
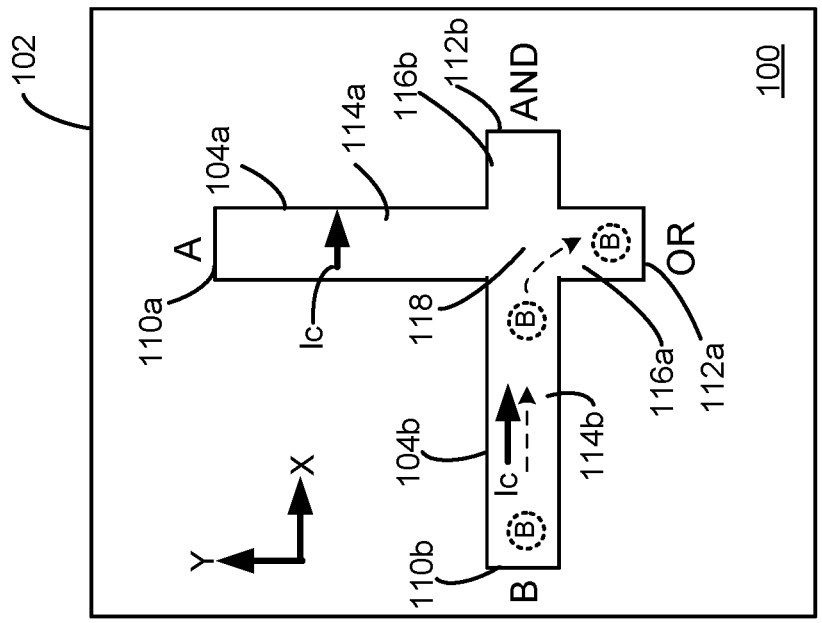
FIGS. 2B to 2E show selective movement of the skyrmion from the first end of the first nanotrack and the second nanotrack to the second end of the first nanotrack and the second end of the second nanotrack, for various combinations of input values shown in the truth table of FIG. 2A, according to one aspect of the present disclosure.

FIG. 2A shows an example truth table 200 for a two input logic device, according to an example of this disclosure. Referring now to table 200, Input A is shown in column 202, input B is shown in column 204, output is shown in column 206, and type of logic is shown in column 208. Rows 210-216 show an OR logic implementation. Rows 218-224 show an AND logic implementation. For example, referring to rows 212, 214, and 216, when one of the inputs A, and B is a 1, the output is 1, representing an OR logic. Further, referring to rows 218, 220, and 222, when one of the inputs is a 0, the output is a 0, representing an AND logic. Similarly, referring to row 224, if both the inputs are a 1, the output is a 1, representing an AND logic. As previously described, presence of a skyrmion at the input is indicative of a value of 1 and absence of a skyrmion at the input is indicative of a value of 0. Further, presence of a skyrmion at the output is indicative of a value of 1 and absence of a skyrmion at the output is indicative of a value of 0. Now, referring to FIGS. 2B to 2E, selective movement of the skyrmion from the first end of the nanotrack to the second end of the nanotrack is now described, for various combinations of input values.

Figure 2B:
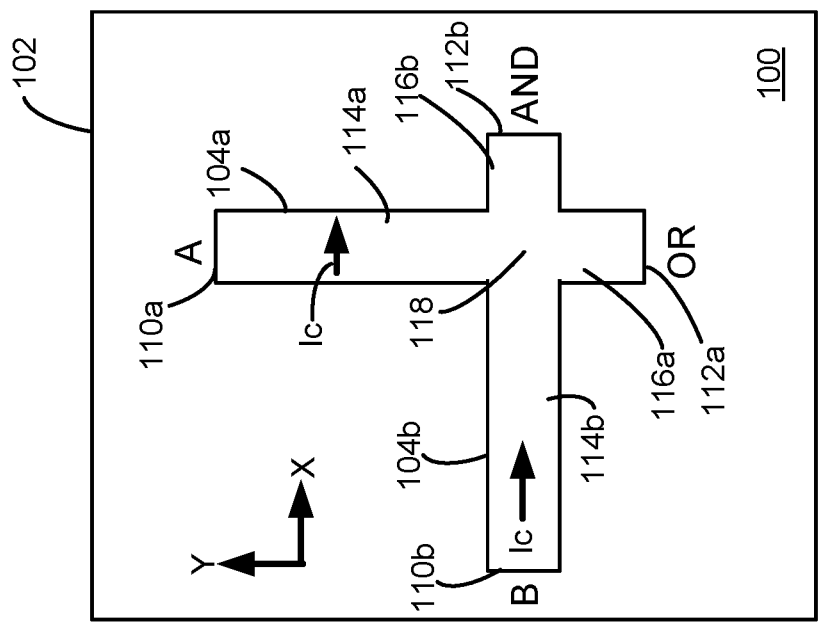

Now, referring to FIG. 2B, logic device 100 is shown with input values A and B set as {0, 0} respectively, at the first end of the first nanotrack 104a and the second nanotrack 104b. This corresponds to an input value as shown in rows 210 and 218 of the table 200 of FIG. 2A. As previously described, for a value of 0, no skyrmion is nucleated at input A and B. When a charge current Ic is passed, no skyrmion is present to move. So, the second end 112a and 112b will not have any skyrmion present. This will give an output value of 0 at the second end 112a and an output value of 0 at the second end 112b. As previously described, output at the second end 112a represents an output according to an AND logic and the output at the second end 112b represents an output according to an OR logic, both of which are 0 in this example. This corresponds to the output value shown in table 200, row 210 for the OR logic and row 218 for the AND logic.

Now, referring to FIG. 2C, skyrmion is selectively nucleated at input A (referred to as skyrmion A), about the first end 110a of the first nanotrack 104a. No skyrmion is nucleated at input B, about the first end 110b of the second nanotrack 104b. This represents an input value of {1, 0} and corresponds to an input value as shown in rows 212 and 220 of the table 200 of FIG. 2A. When charge current Ic is passed in the +X direction, the skyrmion A at input A will move towards the second end 112a of the first nanotrack 104a and eventually reach the second end 112a of the first nanotrack 104a. And, no skyrmion is present at the second end 112b of the second nanotrack 104b.

As previously described, the output is measured by sensors disposed about the second end 112a of the first nanotrack 104a and second end 112b of the second nanotrack 104b. In this example, we notice that the skyrmion A is now disposed at the second end 112a of the first nanotrack 104a. As there is a skyrmion present at the second end 112a of the first nanotrack 104a, the sensor will detect the presence of the skyrmion and yield a value of 1. And, no skyrmion is present at the second end 112b of the second nanotrack 104b, the sensor will detect absence of the skyrmion and yield a value of 0. This result is consistent with the result expected according to rows 212 and 220 of the truth table 200 of FIG. 2A.

Figure 2E:
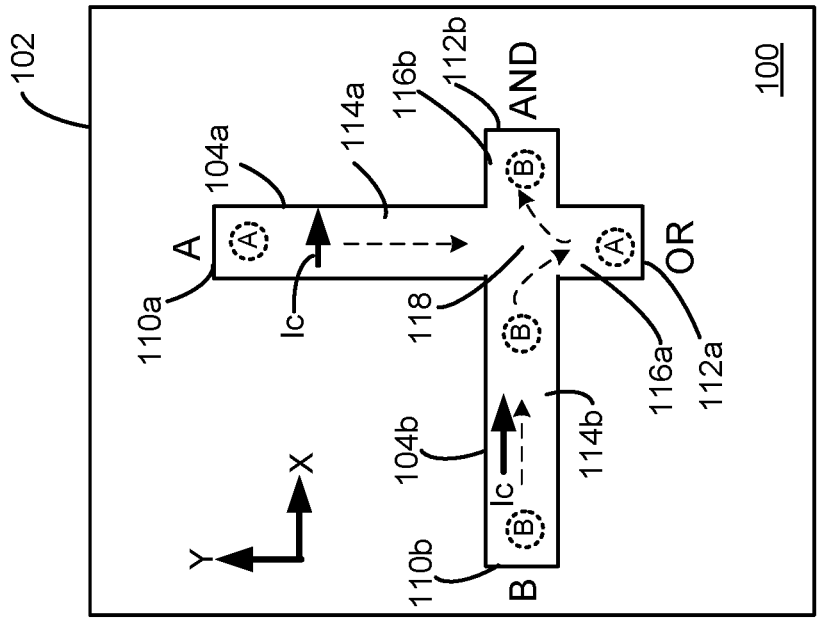
Figure 2D:
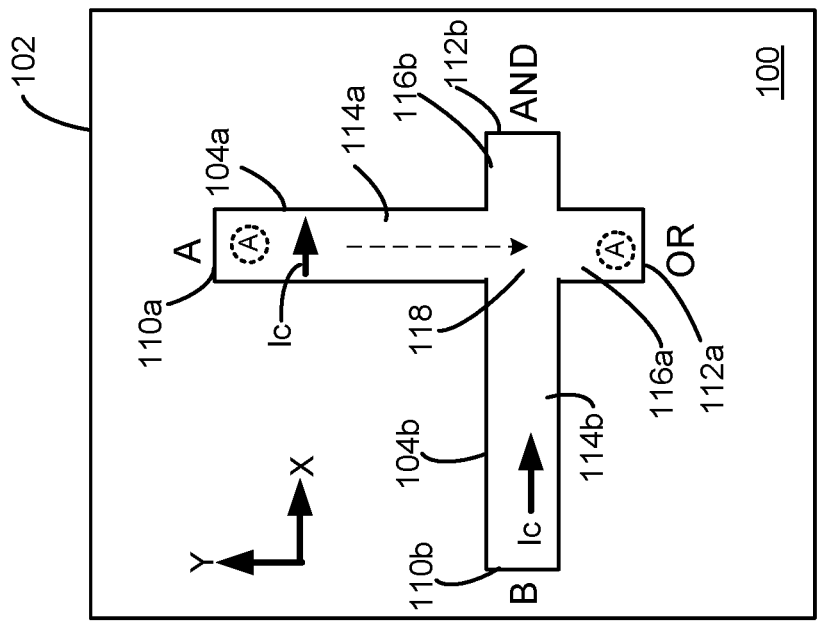

Now, referring to FIG. 2D, skyrmion is selectively nucleated at input B (referred to as skyrmion B), about the first end 110b of the second nanotrack 104b. No skyrmion is nucleated at input A, about the first end 110a of the first nanotrack 104a. This represents an input value of {0, 1} and corresponds to an input value as shown in rows 214 and 222 of the table 200 of FIG. 2A. When charge current Ic is passed in the +X direction, the skyrmion B at input B will move towards the second end 112b of the second nanotrack 104b. As previously mentioned, skyrmion B has a tendency to move towards −Y, and when the skyrmion B reached the overlap portion 118, the skyrmion B will move into the short portion 116a of the first nanotrack 104a and eventually reach the second end 112a of the first nanotrack 104a. And, no skyrmion is present at the second end 112b of the second nanotrack 104b.

As previously described, the output is measured by the sensor disposed about the second end 112a of the first nanotrack 104a and second end 112b of the second nanotrack 104b. In this example, we notice that the skyrmion B is now disposed at the second end 112a of the first nanotrack 104a. As there is a skyrmion present at the second end 112a of the first nanotrack 104a, the sensor will detect the presence of the skyrmion and yield a value of 1. And, no skyrmion is present at the second end 112b of the second nanotrack 104b, the sensor will detect absence of the skyrmion and yield a value of 0. This result is consistent with the result expected according to rows 214 and 222 of the truth table 200 of FIG. 2A.

Now referring to FIG. 2E, skyrmion is selectively nucleated at input A (referred to as skyrmion A), about the first end 110a of the first nanotrack 104a. Further, another skyrmion is selectively nucleated at input B (referred to as skyrmion B), about the first end 110b of the second nanotrack 104b. This represents an input value of {1, 1} and corresponds to an input value as shown in rows 216 and 224 of the table 200 of FIG. 2A. When charge current Ic is passed in the +X direction, the skyrmion A at input A will move towards the second end 112a of the first nanotrack 104a. Similarly, skyrmion B at input B will move towards the second end 112b of the second nanotrack 104b. As previously mentioned, the velocity of movement of skyrmion A is higher than the velocity of movement of skyrmion B. Therefore, before skyrmion B reaches the overlap region 118, skyrmion A would have entered the short portion 116a of the first nanotrack 104a and eventually reach the second end 112a of the first nanotrack 104a. As previously mentioned, skyrmion B has a tendency to move towards −Y, and when the skyrmion B reached the overlap portion 118, the skyrmion B will try to move into the short portion 116a of the first nanotrack 104a, however, the skyrmion A that is already present in the short portion 116a of the first nanotrack 104a will repel the skyrmion B. Thereafter, skyrmion B continues to move into the short portion 116b of the second nanotrack 104b and eventually reaches the second end 112b of the second nanotrack 104b.

As previously described, the output is measured by the sensor disposed about the second end 112a of the first nanotrack 104a and second end 112b of the second nanotrack 104b. In this example, we notice that the skyrmion A is now disposed at the second end 112a of the first nanotrack 104a and skyrmion B is now disposed at the second end 112b of the second nanotrack 104b. As there is a skyrmion present at both the second end 112a and second end 112b, the sensor will detect the presence of the skyrmion and yield a value of {1, 1}. This result is consistent with the result expected according to rows 216 and 224 of the truth table 200 of FIG. 2A.

Figure 3:
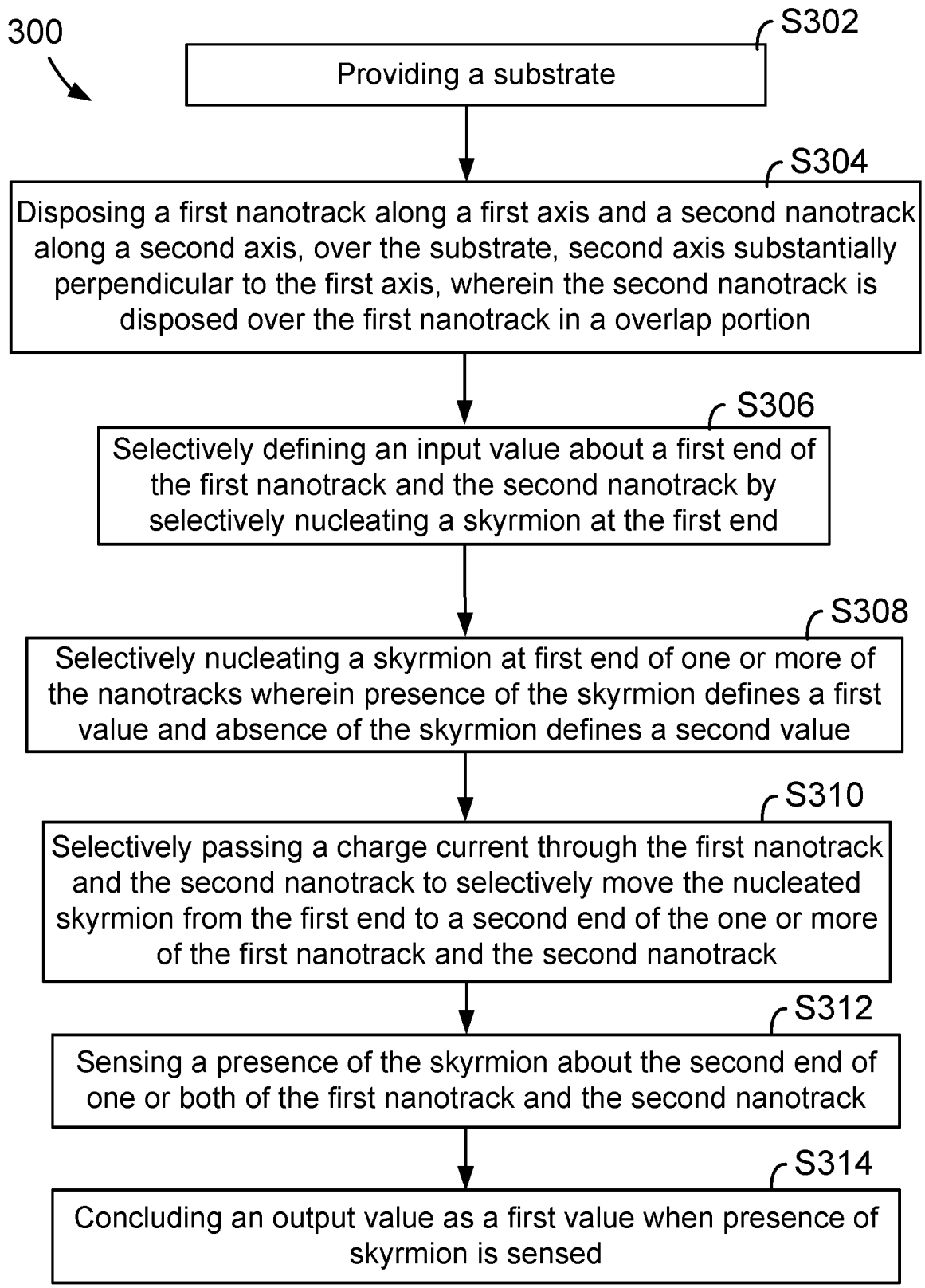
FIG. 3 shows an example flow diagram, according to one aspect of the present disclosure.

Now, referring to FIG. 3, an example flow diagram 300 is described. In block S302, a substrate is provided. For example, substrate 102 is provided.

In block S304, a first nanotrack is disposed over the substrate along a first axis and a second nanotrack is disposed over the substrate along a second axis, second axis substantially perpendicular to the first axis, wherein the second nanotrack is disposed over the first nanotrack in a overlap portion. For example, first nanotrack 104a, second nanotrack 104b are provided. The first nanotrack 104a is disposed along the Y axis and the second nanotrack 104b is disposed along the X axis. The first nanotrack 104a and second nanotrack 104b overlap with each other, about the overlap portion 118.

In block S306, an input value is defined about a first end of the first nanotrack and first end of the second nanotrack by selectively nucleating a skyrmion at the first end. For example, first nanotrack 104a has a first end 110a and the second nanotrack 104b has a first end 110b. A skyrmion is selectively nucleated at the first end, by the nucleating device 106a and 106b.

In block S308, a skyrmion is selectively nucleated at the first end of one or more of the nanotracks, wherein a presence of the skyrmion defines a first value and absence of the skyrmion defines a second value. Various combinations of selectively nucleating one or more skyrmions was previously described with reference to FIGS. 2B-2E. For example, referring to FIG. 2E, logic device 100 was shown with input values A, and B set as {1, 1} respectively, at the first end of the first nanotrack 104a and the second nanotrack 104b. As previously described, a skyrmion is selectively nucleated at inputs A, and B. Nucleated skyrmion at input A, and B are shown as skyrmion A, and skyrmion B.

In block S310, a charge current is selectively passed through the ferromagnetic nanotrack to selectively move the nucleated skyrmion from the first end to the second end of one or more of the first nanotrack and second nanotrack. As previously described with reference to FIGS. 2B-2E, when charge current Ic is passed in the +X direction, the skyrmions will move towards the second end of the nanotracks.

In block S312, a presence of the skyrmion is sensed about the second end of one or both of the first nanotrack and the second nanotrack. For example, presence of the skyrmion is sensed about the second end of the first nanotrack 104a and second nanotrack 104b.

In block S314, concluding an output value as a first value, when the presence of the skyrmion is sensed. For example, presence of the skyrmion about the second end of the first nanotrack 104a is indicative of an output of first value.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
providing a substrate;
disposing a first nanotrack disposed over the substrate, along a first axis, the first nanotrack including a long portion, an overlap portion, and a short portion, a first end of the first nanotrack disposed about the long portion, a second end of the first nanotrack disposed about the short portion;
disposing a second nanotrack disposed over the substrate, along a second axis, the second axis substantially perpendicular to the first axis, the second nanotrack including a long portion, an overlap portion and a short portion, a first end of the second nanotrack disposed about the long portion, a second end of the second nanotrack disposed about the short portion, wherein, the overlap portion of the second nanotrack disposed over the overlap portion of the first nanotrack;
selectively defining an input value about the first end of the first nanotrack by selectively nucleating a skyrmion at first end of the first nanotrack, wherein presence of the skyrmion indicative of a first value and absence of the skyrmion indictive of a second value;
selectively defining another input value about the first end of the second nanotrack by selectively nucleating a skyrmion at the first end of the second nanotrack, wherein presence of the skyrmion indicative of a first value and absence of the skyrmion indictive of a second value;
selectively passing a charge current through the first nanotrack and the second nanotrack to selectively move the nucleated skyrmions towards the second end of the first nanotrack and the second nanotrack, charge current passed along the second axis;
sensing the presence of the skyrmion about the second end of the first nanotrack and the second end of the second nanotrack; and
concluding an output value as the first value when the presence of the skyrmion is sensed.

2. The method of claim 1, wherein, at least one skyrmion in one of the nanotrack moves to an adjacent nanotrack, via the at least one connector nanotrack.

3. The method of claim 1, wherein, the nucleated skyrmion in the first nanotrack moves faster than the nucleated skyrmion in the second nanotrack.

4. The method of claim 1, further including,
selectively disposing at least one nucleating device adjacent the first end of the first nanotrack and the first end of the second nanotrack; and
selectively energizing the nucleating device to selectively nucleate skyrmion in one or more of the first end of the first nanotrack and the first end of the second nanotrack, to indicate the input value.

5. The method of claim 1, further including,
selectively disposing at least one sensing device adjacent the second end of the first nanotrack and the second end of the second nanotrack to selectively sense the presence of the skyrmion about the second end of the first nanotrack and the second end of the second nanotrack.

6. The method of claim 1, wherein, the second end of the first nanotrack is indicative of an output of an OR logic and the second end of the second nanotrack is indicative of an output of an AND logic.

7. The method of claim 1, wherein,
a length of the first portion of the first nanotrack and the first portion of the second nanotrack is about 160 nm;
a length of the second portion of the first nanontrack and the second portion of the second nanotrack is about 60 nm; and
a width of the first nanotrack and the second nanotrack is about 80 nm.

8. The method of claim 1, wherein the skyrmion selectively moving from the first end to the second end of the second nanotrack selectively shifts to the second end of the first nanotrack about the overlap portion of the second nanotrack, unless another skyrmion is positioned in the second end of the first nanotrack.

9. The method of claim 8, wherein the movement of the skyrmion in the second nanotrack is biased to move towards the second end of the first nanotrack.

10. A system, including:
a substrate;
a first nanotrack disposed over the substrate, along a first axis, the first nanotrack including a long portion, an overlap portion, and a short portion, a first end of the first nanotrack disposed about the long portion, a second end of the first nanotrack disposed about the short portion;
a second nanotrack disposed over the substrate, along a second axis, the second axis substantially perpendicular to the first axis, the second nanotrack including a long portion, an overlap portion and a short portion, a first end of the second nanotrack disposed about the long portion, a second end of the second nanotrack disposed about the short portion, wherein, the overlap portion of the second nanotrack disposed over the overlap portion of the first nanotrack;

an input value is selectively defined about the first end of the first nanotrack by selectively nucleating a skyrmion at first end of the first nanotrack, wherein presence of the skyrmion indicative of a first value and absence of the skyrmion indictive of a second value;

another input value is selectively defined about the first end of the second nanotrack by selectively nucleating a skyrmion at the first end of the second nanotrack, wherein presence of the skyrmion indicative of a first value and absence of the skyrmion indictive of a second value;

a charge current is selectively passed through the first nanotrack and the second nanotrack to selectively move the nucleated skyrmions towards the second end of the first nanotrack and the second nanotrack, charge current passed along the second axis;

presence of the skyrmion is sensed about the second end of the first nanotrack and the second end of the second nanotrack; and an output value is concluded as the first value when the presence of the skyrmion is sensed.

11. The system of claim 10, wherein, at least one skyrmion in one of the nanotracks moves to another of the nanotrack, about the overlap portion.

12. The system of claim 10, wherein, the nucleated skyrmion in the first nanotrack moves faster than the nucleated skyrmion in the second nanotrack.

13. The system of claim 10, further including,
at least one nucleating device is selectively disposed adjacent the first end of the first nanotrack and the first end of the second nanotrack; and
the nucleating device is selectively energized to selectively nucleate skyrmion in one or more of the first end of the first nanotrack and the first end of the second nanotrack, to indicate the input value.

14. The system of claim 10, further including,
at least one sensing device is selectively disposed adjacent the second end of the first nanotrack and the second end of the second nanotrack to selectively sense the presence of the skyrmion about the second end of the first nanotrack and the second end of the second nanotrack.

15. The system of claim 10, wherein, the second end of the first nanotrack is indicative of an output of an OR logic and the second end of the second nanotrack is indicative of an output of an AND logic.

16. The system of claim 10, wherein,
a length of the first portion of the first nanotrack and the first portion of the second nanotrack is about 160 nm;
a length of the second portion of the first nanontrack and the second portion of the second nanotrack is about 60 nm; and
a width of the first nanotrack and the second nanotrack is about 80 nm.

17. The system of claim 10, wherein the skyrmion selectively moves from the first end to the second end of the second nanotrack selectively shifts to the second end of the first nanotrack about the overlap portion of the second nanotrack, unless another skyrmion is positioned in the second end of the first nanotrack.

18. The system of claim 17, wherein the movement of the skyrmion in the second nanotrack is biased to move towards the second end of the first nanotrack.

\* \* \* \* \*